United States Patent
Tateishi et al.

[11] Patent Number: 5,898,708
[45] Date of Patent: Apr. 27, 1999

[54] ERROR CORRECTION APPARATUS AND METHOD

[75] Inventors: Toru Tateishi, Kokubunji; Katsumi Murano, Tachikawa; Takayasu Aoki, Machida; Hiroaki Sato, Chofu, all of Japan

[73] Assignee: Kabushiki Kaisha Toshiba, Japan

[21] Appl. No.: 08/491,257

[22] Filed: Jun. 16, 1995

[30] Foreign Application Priority Data

Jun. 16, 1994 [JP] Japan ................................ 6-134485

[51] Int. Cl.⁶ ............................................. H03M 13/00
[52] U.S. Cl. .................... 371/37.1; 371/37.3; 371/37.4; 371/38.1; 371/45
[58] Field of Search .................... 371/37.1, 37.5, 371/37.7, 37.4, 37.3, 38.1, 27, 40.1, 3, 45; 340/430; 360/32; 528/354

[56] References Cited

U.S. PATENT DOCUMENTS

| | | | |
|---|---|---|---|
| 3,688,265 | 8/1972 | Carter et al. ........................ | 340/430 |
| 4,282,551 | 8/1981 | Kanazawa et al. .................. | 360/32 |
| 4,477,903 | 10/1984 | Schouhamer Immink et al. ... | 371/37.4 |
| 4,486,882 | 12/1984 | Piret et al. .......................... | 371/45 |
| 4,498,175 | 2/1985 | Nagumo et al. . | |
| 4,527,269 | 7/1985 | Wood et al. ......................... | 371/3 |
| 4,539,394 | 9/1985 | Tomimitsu .......................... | 258/354 |
| 4,593,395 | 6/1986 | Schouhamer Immink et al. ... | 371/37.4 |
| 4,653,052 | 3/1987 | Doi et al. ............................ | 371/39 |
| 4,736,376 | 4/1988 | Stiffler .................................. | 371/37.1 |
| 4,833,678 | 5/1989 | Cohen . | |
| 4,873,688 | 10/1989 | Maki et al. . | |
| 4,888,774 | 12/1989 | Kosuge et al. ..................... | 371/38.1 |
| 4,939,733 | 7/1990 | Furutani ............................. | 371/40.1 |
| 5,357,523 | 10/1994 | Bogholtz, Jr. et al. ............. | 371/27 |
| 5,361,266 | 11/1994 | Kodama et al. . | |
| 5,384,786 | 1/1995 | Dudley et al. . | |
| 5,416,786 | 5/1995 | Lin et al. . | |
| 5,422,895 | 6/1995 | Nguyen et al. . | |
| 5,430,739 | 7/1995 | Wei et al. . | |
| 5,440,570 | 8/1995 | Wei et al. . | |
| 5,450,420 | 9/1995 | An et al. . | |
| 5,463,642 | 10/1995 | Gibbs et al. . | |
| 5,490,154 | 2/1996 | Mester . | |

*Primary Examiner*—Reba I. Elmore
*Assistant Examiner*—McDieunel Marc
*Attorney, Agent, or Firm*—Banner & Witcoff, Ltd.

[57] ABSTRACT

When a receiver unit receives second data composed of check bits and first data obtained by encoding information bits indicating the communication contents by way of a first generator matrix based on a first generating polynomial, and then further encoding the first data by way of a second generator matrix of an irreducible standard form based on a second generating polynomial, an error location detector decodes the second data received by way of a second check matrix that is orthogonal to the second generator matrix so as to detect errors produced in the first data. A dummy syndrome generator generates a dummy syndrome of the error produced in the information bits based on the detected error location and on the first generating polynomial. A syndrome generator takes the product of the data obtained by excluding the check bits from the second data received by the receiver unit and the first check matrix that is orthogonal to the first generator matrix so as to generate a syndrome that indicates the error syndrome produced in the information bits. Finally, an error corrector corrects errors produced in the information bits if the dummy syndrome generated by the dummy syndrome generator is the same as the syndrome generated by the syndrome generator.

14 Claims, 6 Drawing Sheets

ERROR CORRECTION APPARATUS AND METHOD

BACKGROUND OF THE INVENTION

1. Field of the Invention

The present invention relates in general to an error correction apparatus and method, and in particular to an error correction apparatus and method with which a plurality of error correction encodings are performed for communication contents, and error corrections are reduced.

2. Description of the Related Art

With a conventional error correction technique for correcting errors that occurred during the sending of communication contents, the transmitting station would subject the communication contents (hereinafter referred to as "information bits") to redundant encoding before transmission, and the receiving station would correct errors based on this redundant code. With this error correction technique, the encoding method and generating polynomial to be used are specified based on the length of the information bits and on the error correction capability provided, coding is performed by producing a generator matrix from this coding method and generating polynomial, and decoding is performed by using a check matrix that is orthogonal to the generator matrix.

In specific terms, at the transmitting station, an information string is produced by taking the inner product of the information bit string and the generator matrix G, and the communication data containing this information string is transmitted to the receiving station, while at the receiving station, the error syndrome is calculated by taking the inner product of the received information string and the check matrix H (G·H=0) that is orthogonal to this generator matrix G.

Here, this "syndrome" refers to data indicating whether or not there are errors in the received information string, and confirmation of this syndrome allows errors to be detected. This syndrome, however, does not directly indicate the error location, so specification of the error location requires factoring or the like to be performed based on this syndrome. In specific terms, if this syndrome is "0," it means that there are no errors in the received information string, and if it is "1," it means that some kind of error is present.

Thus, performing error correction using a syndrome allows bit errors and burst errors to be corrected automatically. Nevertheless, even when this error correction technique is used, it does not keep track of all the errors, and skipped errors and improper corrections sometimes occur.

As a result, a system that demands a high level of communication quality does not stop at using error correction by itself, but rather employs a technique for enhancing the reliability of the error correction by combining error correction with error detection. For example, information bits are multiplied by a generator matrix G1 to produce an information string having undergone error detection coding, which in turn is multiplied by a generation matrix G2 to produce data having undergone error correction coding. The transmitting station sends the data thus produced to the receiving station, while the receiving station subjects this data to error correction using a check matrix H2 that is orthogonal to the generator matrix G2, after which it confirms whether there are any errors in the data by using a check matrix H1 that is orthogonal to the generator matrix G1.

The procedure of the above prior art, which combines an error correction technique with an error detection technique, will now be described.

Figure 9:
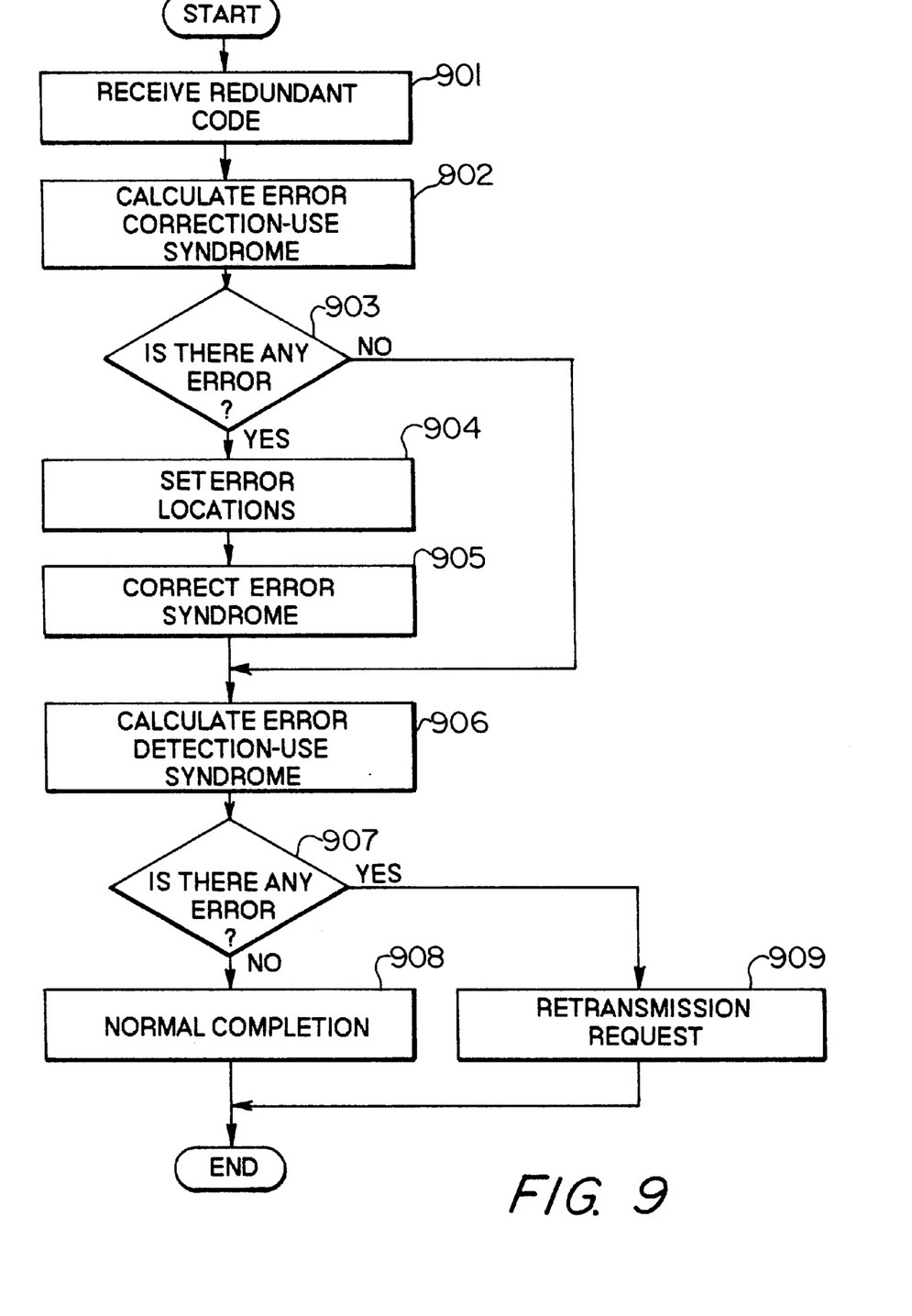
FIG. 9 is a flow chart illustrating the procedure of prior art in which both error correction encoding and error detection encoding are used.

FIG. 9 is a flow chart illustrating the procedure at the receiving station when an error correction technique is combined with an error detection technique. As shown in FIG. 9, when an information string transmitted from the transmitting station is received by the receiving station (step 901), the first thing the receiving station does is to confirm whether there are any errors in the information string. Specifically, the receiving station computes the error correction syndrome by multiplying the received information string by the check matrix H2 (step 902), and confirms whether an error has been generated in the information string based on this syndrome (step 903).

When an error is present in the information string, the error location is specified based on the error correction syndrome (step 904), and the error location is corrected (step 905). Here, the specification of the error location in step 904 will vary with the encoding method, but in the case of a double error correction code, the error location can be specified either by factoring a polynomial having the value of the syndrome as a coefficient, or by consulting a table listing the results of this factoring.

Next, in order to verify that the error correction of steps 903 through 905 above has actually been carried out, the error detection syndrome is calculated based on the check matrix H1 (step 906), and the information string that has undergone error correction is examined to see if any errors remain (step 907).

If there are no errors in the information string that has undergone error correction, then it is determined that there are no skipped errors or improper corrections, and the process is ended normally (step 908), but if there are errors present, then it is recognized that skipped errors or improper correction has occurred, and retransmission is requested (step 909).

Thus, using prior art in which an error correction technique is combined with an error detection technique allows skipped errors and improper correction to be confirmed, and the reliability of the communication information to be improved. However, with this prior art, since the determination as to whether correction has been performed is made after the errors produced in the information string have been corrected, error detection cannot be performed until the correction has been completed. Consequently, the correction process takes longer than when error correction is performed by itself, i.e., it is longer by the amount of time it takes to determine whether the error correction is proper using an error detection technique (syndrome generation time+time required for input/output).

Therefore, prior art in which an error correction technique is combined with an error detection technique cannot be used in a real application because improved reliability is achieved at the cost of processing time.

There is a technique with which error correction can be made parallel by using dual error correction techniques, and which does not involve a combination of an error correction technique and an error detection technique. Specifically, this technique comprises detecting error locations by means of dual error correction techniques, comparing the error locations of the two, and performing error correction if the error locations are in agreement.

In this case, the generator matrix G2 used in the second error correction encoding must be in an irreducible standard form so that the transmitted information string will be in a joint data format of check bits and data encoded with G1, and so that decoding by the check matrix H1 corresponding to the generator matrix G1 can be carried out in parallel with decoding by the check matrix H2 corresponding to the generator matrix G2.

However, when this technique is used, as relates to finally confirming the correctness of errors by contrasting error locations of the two, decoding by the check matrix H1 and the check matrix H2 is insufficient with syndrome calculation, and detection of error locations must be performed in both cases.

When this error location detection is carried out in duality, not only does the number of check bits to be added increase, but error location, which is the most complicated part of error correction, must be carried out twice, which is inefficient.

As discussed above, when prior art involving a combination of an error correction code and an error detection code was used, the problem was that a processing delay was incurred because the processing had to be carried out sequentially, and with prior art in which error correction encoding was carried out in duality, the problem was that the code length increased and the complicated specification of the error location had to be carried out twice.

SUMMARY OF THE INVENTION

In view of this, an object of the present invention is to solve the above problems and provide an error correction apparatus and method with which a determination of proper correction can be made efficiently and processing delay can be reduced in the course of improving the reliability of communication information by subjecting information bits to error correction encoding in convolutional form.

In order to achieve the stated object, the present invention is designed such that, when an error correction technique and an error detection technique are combined, a determination as to proper errors is made on the syndrome level rather than detecting errors after error correction of the information bits.

Specifically, when the error location is detected by an error correction technique, the syndrome that is probably produced when the error detection technique detects the same error is calculated backward from the error location detected as a dummy syndrome, and the syndrome actually produced by the error detection technique is compared with the dummy syndrome to confirm that the error is proper on the syndrome level.

Even when prior art is used, if the leading bit that is transmitted serves as the reference location for errors, and if the same encoding method is used, then it can be confirmed that the error is proper on the syndrome level. However, when variable-length data is used and the reference location of the error is the last bit, or when an encoding method with a different syndrome format is used (such as Hamming code), it cannot be determined that the error is proper on the syndrome level.

The present invention allows confirmation that the error is proper on the syndrome level even when variable-length data is used and the reference location of the error is the last bit, or when an encoding method with a different syndrome format is used (such as Hamming code).

Also, since error correction and error detection can be carried out in parallel, error correction can be accomplished more efficiently.

Furthermore, since no correction is performed when the dummy syndrome calculated backward from the error location does not match up with the syndrome determined from the received data, the time required for error correction can be shortened.

DESCRIPTION OF THE PREFERRED EMBODIMENTS

The first embodiment of the present invention will now be described while referring to the accompanying drawings. In this first embodiment, the description will be for a case in which error correction encoding is performed after error detection encoding has been performed for variable-length communication contents (information bits) of 64 bits to 512 bits.

Figure 1:
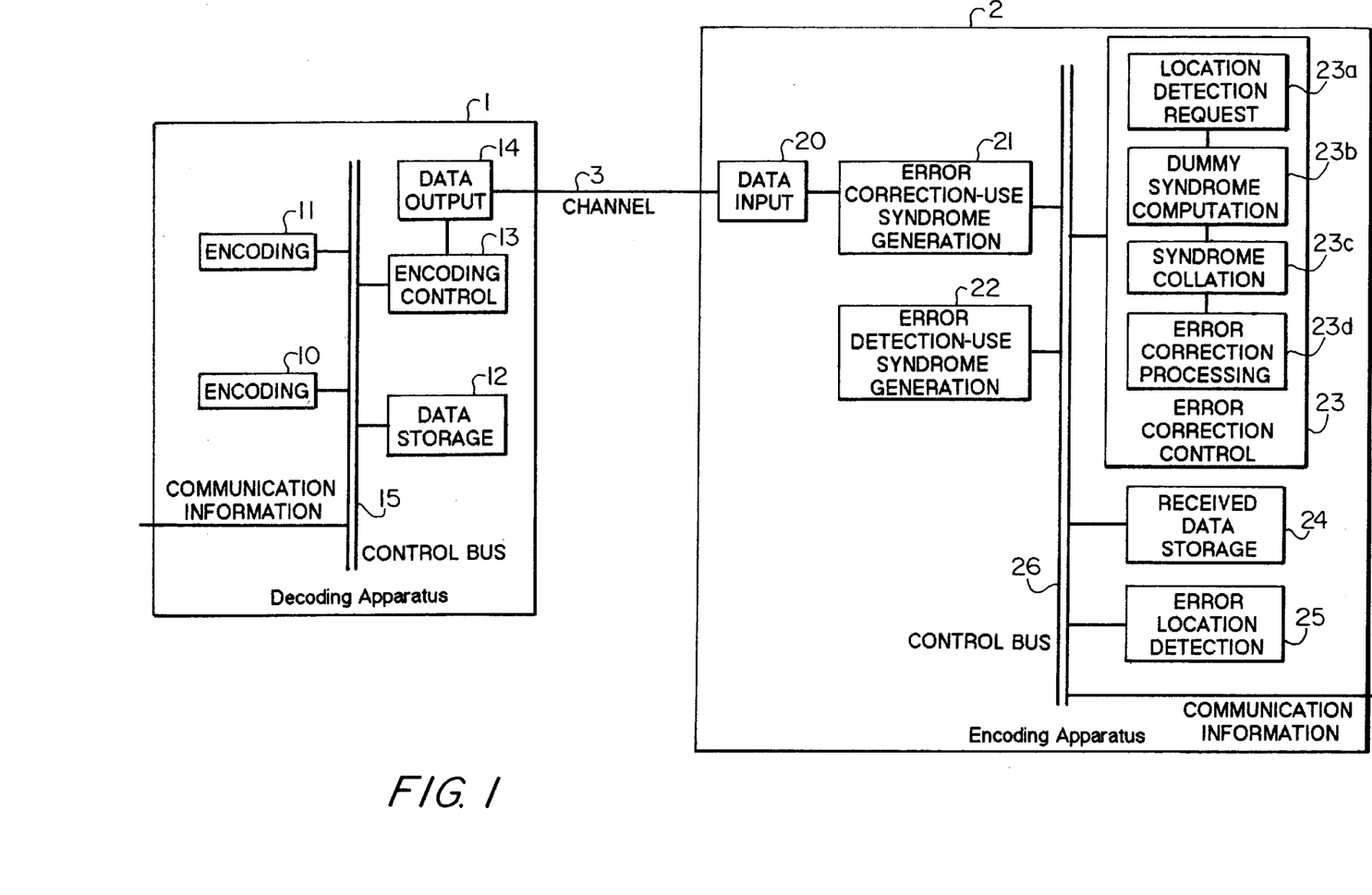
FIG. 1 is a block diagram illustrating the structure of the error correction system in the first embodiment according to the present invention.

FIG. 1 is a block diagram illustrating the structure of the error correction system in the first embodiment pertaining to the present invention.

As shown in FIG. 1, this error correction system comprises an encoding apparatus 1, which outputs to a communication channel 3 communication data including an information string that has undergone error detection encoding and error correction encoding in communication contents received from a user, and a decoding apparatus 2, which outputs communication information obtained by decoding the communication data received from this communication channel.

First, the encoding apparatus 1 comprises an encoding component 10, an encoding component 11, a data storage component 12, an encoding control component 13, and a data output component 14.

The encoding component 10 receives input data via a control bus 15 under the control of the encoding control component 13, and subjects the input data to error detection encoding. In specific terms, with this encoding component 10, error detection encoding is performed by taking the inner product of the input data and the generator matrix G1. In this embodiment, this generator matrix G1 is used in the irreducible standard form, and the data format for the encoding data is a data format in which check bits are added to the input data.

The encoding component 11 is controlled by the encoding control component 13 and performs error correction encoding using the generator matrix G2 with an irreducible standard form, just as with the encoding component 10.

The error correction encoding performed by the encoding component 11 is the same as the error detection encoding performed by the encoding component 10 in terms of the inner product of the input data and the generator matrix, but the difference lies in the fact that while the generator matrix G1 used by the encoding component 10 does not necessarily have to be in the irreducible standard form, the generator matrix G2 used by the encoding component 11 does have to be in the irreducible standard form.

The reason for this is that if the generator matrix G2 used by the encoding component 11 is not in the irreducible standard form, the information string will not have a data format in which check bits are added to the input data, and parallel processing in the decoding apparatus discussed below cannot be performed.

The data storage component 12 is a buffer that temporarily stores the input data input to the transmission component 1. The input data stored in this data storage component 12 is sequentially encoded.

The encoding control component 13 is a control component that sequentially encodes and controls the data stored in the data storage component 12. In specific terms, this component controls the system such that the data stored in the data storage component 12 is first output to the encoding component 10, and error detection is performed for the information bits, after which this data is output to the encoding component 11 and subjected to error correction encoding, and then output to the data output component 14.

Specifically, the encoding object of the encoding component 10 is the input communication information itself, and the encoding object of the encoding component 11 is the encoded data output by the encoding component 10. The encoding components 10 and 11 both make use of generator matrices in an irreducible standard form, resulting in a format in which error detection check bits (or EDCB1) and error correction check bits (or EDCB1) are added to the information bits that indicate the communication information.

The data output component 14 is a processing component that adds communication flags, etc., to the information string received from the encoding control component 13 for output to the communication channel 3.

Using an encoding apparatus 1 having the above-mentioned structure allows the communication data obtained by encoding in duality the communication information input to the encoding apparatus 1 to be output to the communication channel 3.

Next, the data construction of the communication data output from the above-mentioned encoding apparatus 1 will be described.

Figure 2:
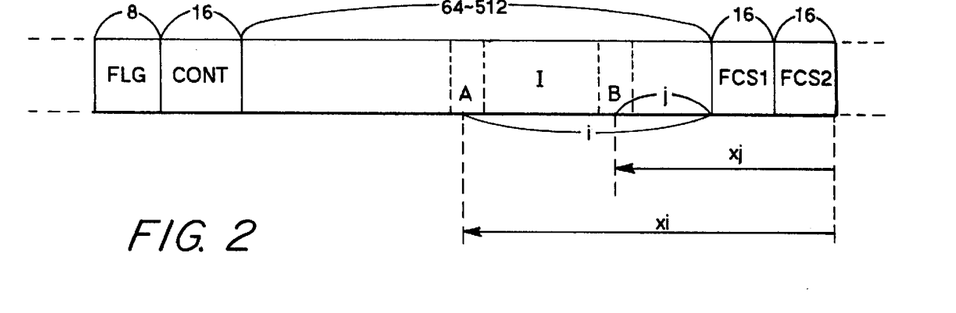
FIG. 2 is a diagram illustrating the data construction of a communication data when error detection encoding and error correction encoding are performed for variable-length information bits.

FIG. 2 is a diagram illustrating the data construction of the communication data in the communication channel 3 shown in FIG. 1.

As shown in FIG. 2, the communication data comprises a communication-use flag (FLG), a control signal (CONT), and the like added to a variable-length information bit (I) composed of 64 to 512 bits, an error detection-use check bit (EDCB) composed of 16 bits, and an error correction-use check bit (ECCB2) composed of 16 bits.

Specifically, EDCB1 is an error detection-use check bit added by the encoding component 10 of the encoding apparatus 1, and ECCB2 is an error correction-use check bit added by the encoding component 11 of the encoding apparatus 1.

In this embodiment, since the information bits are treated as variable-length, in the specification of the error location in the decoding apparatus 2 discussed below, the error locations are counted from the EDCB1 or ECCB2 side, rather than being counted from the FLG side.

Therefore, when decoding is performed using ECCB2, the error location is expressed using the last bit of ECCB2 as the standard, and when decoding is performed using EDCB1, the error location is expressed using the last bit of EDCB1 as the standard.

For example, when decoding is performed using ECCB2, if we assume that errors are detected at bit A and bit B shown in FIG. 2, then the error location of bit A and bit B is expressed as follows.

bit A: $xi=16+16+I$
bit B: $xj=16+16+j$

When decoding is performed using EDCB1, if we assume that errors are detected at bit A and bit B, then the error location of bit A and bit B is expressed as follows.

bit A: $xi=16+I$
bit B: $xj=16+j$

Thus, there is a shift in the number of bits of EDCB1 (16 bits) between the error location when decoding is performed using ECCB2 and the error location when decoding is performed using EDCB1.

Next will be described the structure of the decoding apparatus 2 that receives and decodes communication data from the above-mentioned communication channel 3.

The decoding apparatus 2 comprises a data input component 20, an error correction-use syndrome generating component 21, an error detection-use syndrome generating component 22, an error correction control component 23, a received data storage component 24, and an error location detection component 25.

The data input component 20 is a processing component that outputs the received data received from the communication channel 3 to the error correction-use syndrome generating component 21, the error detection-use syndrome generating component 22, and the received data storage component 24.

The error correction-use syndrome generating component 21 is a processing component that multiplies the check matrix H2 by the information string of communication data (information bits+EDCB1+ECCB2) and calculates the error correction-use syndrome S2; this component corresponds to the encoding component 11.

In contrast, the error detection-use syndrome generating component 22 is a processing component that multiplies the check matrix H1 by the data obtained by excluding ECCB2 from the information string of the communication data (information bits+EDCB1) and calculates the error detection-use syndrome S1; this component corresponds to the encoding component 10.

Specifically, the check matrix H2 used by the error correction-use syndrome generating component 21 is orthogonal to the generator matrix G2 used by the encoding component 11 ($G2 \cdot H2=0$), and the check matrix H1 used by the error detection-use syndrome generating component 22 is orthogonal to the generator matrix G1 used by the encoding component 11 ($G1 \cdot H1=0$).

The error correction-use syndrome S2 generated by the error correction-use syndrome generating component 21 indicates the error syndrome produced in the information bits, EDCB1, and ECCB2, with the last bit of ECCB2 being used as the reference point of the error location.

Meanwhile, the error detection-use syndrome S1 generated by the error detection-use syndrome generating component 22 indicates the error syndrome produced in the information bits and EDCB1, with the last bit of EDCB1 being used as the reference point of the error location.

Thus, since the error correction-use syndrome generating component 21 calculates the syndrome with the last bit of ECCB2 being used as the reference point, and the error detection-use syndrome generating component 22 calculates the syndrome with the last bit of EDCB1 being used as the reference point, the values of these syndromes are different even if both components use the same check matrix.

The error correction control component 23 is a control component that performs error correction control based on the syndromes S1 and S2 received from the error correction-use syndrome generating components 21 and 22, and has a location detection request component 23a, a dummy syndrome computation component 23b, a syndrome collation component 23c, and an error correction component 23d.

The location detection request component 23a outputs to the error location detection component 25 the syndrome received from the error correction-use syndrome generating component 21 via the control bus 26, requests error location detection of the error location detection component 25, and receives the error location corresponding to this syndrome from the error location detection component 25.

The dummy syndrome computation component 23b is a processing component that, when the error location received from the location detection request component 23a is assumed to be correct, calculates backward the syndrome that is probably generated by the error detection-use syndrome generating component 22 and uses this syndrome as a dummy syndrome.

The syndrome collation component 23c is a processing component that collates the dummy syndrome calculated by the dummy syndrome computation component 23b with the syndrome received from the error detection-use syndrome generating component 22 via the control bus 26.

The error correction component 23d is a processing component that performs error correction based on the collation results of the syndrome collation component 23c. In specific terms, it performs correction of the error location detected by the error location detection component 25 only when the dummy syndrome calculated by the dummy syndrome computation component 23b matches up with the syndrome received from the error detection-use syndrome generating component 22, and makes a retransmission request to the encoding apparatus 1 when the two syndromes do not match up.

Thus, this error correction control component 23 manages the control of the entire decoding apparatus 2, and also verifies that the error correction is proper on the syndrome level.

The received data storage component 24 is a buffer that temporarily stores received data received by the decoding apparatus 2, and when the error correction-use syndrome generating component 21 or the error detection-use syndrome generating component 22 is in operation, the input communication data is temporarily stored in this received data storage component 24. Intermediate data required for the processing of the error correction control component 23 is temporarily stored in this received data storage component 24.

The error location detection component 25 is a processing component that detects an error location based on the error correction-use syndrome S2 generated by the error correction-use syndrome generating component 21 under the control of the error correction control component 23, and outputs this error location to the error correction control component 23.

As previously discussed, the error correction-use syndrome S2 generated by the error correction-use syndrome generating component 21 uses the last bit of FCS2 as the reference point for the error location, so the last bit of FCS2 also serves as the reference point for the error location detected by this error location detection component 25.

Also, since the dummy syndrome computation component 23b generates a dummy syndrome in place of the error detection-use syndrome generating component 22, with this dummy syndrome computation component 23b, a dummy syndrome is computed from the error location detected by the error location detection component 25, with the reference point being the last bit of EDCB1 minus the number of bits of ECCB2 (16 bits).

Thus, this decoding apparatus 2 is structured such that the appropriateness of the error location is verified on the syndrome level, rather than the appropriateness of the error location being verified by collation of each of the error locations detected in duality as with prior art. The reason for this is that backward calculation from the error location is easier than determining the error location from the syndrome.

Next, the procedure of the above-mentioned error correction control component 23 will be described in detail.

Figure 3:
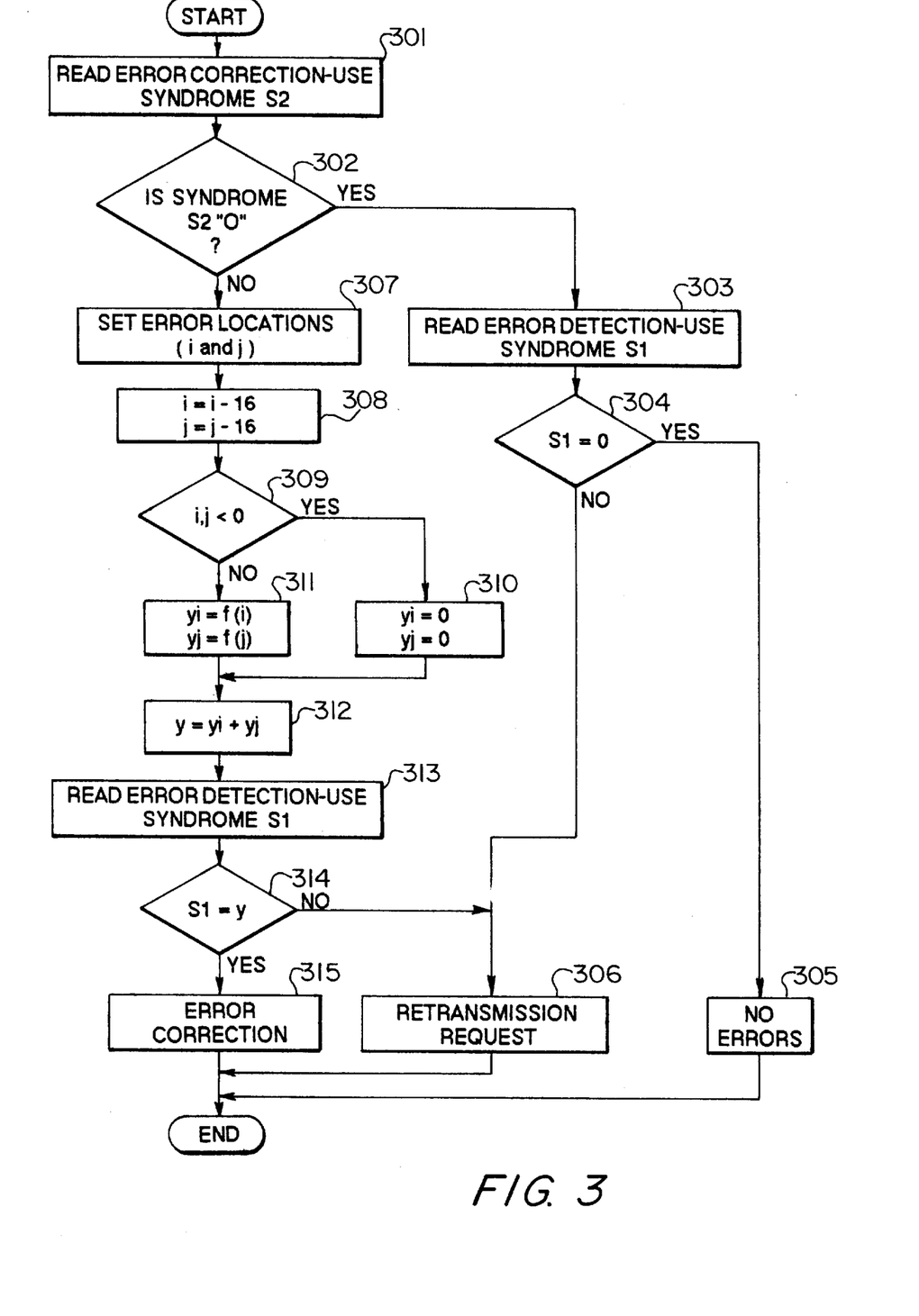
FIG. 3 is a flow chart illustrating the procedure of the error correction control component shown in FIG. 1.

FIG. 3 is a flow chart illustrating the procedure of the error correction control component 23 shown in FIG. 1.

As shown in FIG. 3, the first thing the error correction control component 23 does is receive the error correction-use syndrome S2 generated by the error correction-use syndrome generating component 21 from the control bus (step 301), determine whether or not this syndrome S2 is zero (step 302), and confirm whether there is an error.

Specifically, the syndrome is zero when there are no errors present, and a syndrome of an error is indicated when an error is present, so a check of the received data is performed using this property.

When this syndrome S2 is zero, the error detection-use syndrome S1 generated by the error detection-use syndrome generating component 22 is received from the control bus (step 303), and a determination is made as to whether this error detection-use syndrome S1 is zero (step 304).

When this error detection-use syndrome S1 is zero, processing is completed and deemed to be error-free (step 305), but if this error detection-use syndrome S1 is not zero, a retransmission request is made to the transmission component 1 (step 306), after which processing is completed.

Specifically, the determination of no errors is made only when both the error correction-use syndrome S2 and the error detection-use syndrome S1 are zero, and if the error correction-use syndrome S2 contradicts the error detection-use syndrome S1, then a determination is made that an error has been skipped.

Next will be described a case in which the error correction-use syndrome S2 is not zero in step 302.

In this case, the error correction control component 23 outputs an error correction-use syndrome to the error location detection component 25, and specifies the locations I and j of the error bit (step 307). As previously discussed, the location of this error bit is calculated using the last bit of ECCB2 as a reference.

Once the locations I and j of the error bit have been received from the error location detection component 25, the following subtraction is performed (step 308), after which it is confirmed whether or not I and j are positive (step 309).

I=I−16 j=j−16

Here, the reason why the subtraction of step 308 is performed is that there is a coordinate conversion of the location of the error bit in which the last bit of ECCB2 serves as the reference into the location of the error bit in which the last bit of EDCB1 serves as the reference, and this number of bits must be subtracted when a 16-bit ECCB2 is used as in this embodiment.

The reason for performing the determination of step 309 is that when neither I nor j is positive, there is no error in the information bits (I) or FCS1.

Also, when neither I nor j is positive, i.e., when there is no error in the information bits (I) or EDCB1, this is defined as yi=0 yj=0

(step 310), and when either i or j is positive, i.e., when it is determined that an error has occurred in the in ECCB2, this is defined as yk=0 ($K \leq 0$)

yk=f (k) (k>0)

(step 311). For example, when i is not positive and j is positive yi=0 yj=f (j)

When both i and j are positive, i.e., when it is determined that an error has occurred only in the information bits (I) or EDCB1, this is defined as yi=f (i)

yj=f (i)

(step 311), which yields the following.

y=yi+yj

Here, this yi and yj express the locations I and j of the error bit as the square of the root (primitive root) of the generating polynomial, and f is determined by the encoding method used when encoding is performed by the encoding component 10.

y is a syndrome obtained by affinely calculating backward the syndrome to be generated by the error detection-use syndrome generating component 22 using the error location.

Specifically, in the processing in steps 310 through 312, the syndrome S1 generated by the error detection-use syndrome generating component 22 using the check matrix H1 is calculated backward from the error correction-use syndrome.

Therefore, if this dummy syndrome y and the syndrome S1 match up, then a determination can be made that the error location detected by the error location detection component 25 is correct, and if they do not match up, a determination can be made that the location of the error bit detected by the error location detection component 25 is not correct.

Accordingly, the error detection-use syndrome S1 detected by the error detection-use syndrome generating component 22 is then taken out of the control bus 26 (step 313), and this error detection-use syndrome S1 is examined to see if it matches up with the dummy syndrome y (step 314).

If the two do not match up, a retransmission request is made (step 306), and if the two do match up, the error bit present at the location detected by the error location detection component 25 is corrected.

When the above series of processing is performed, the determination as to the correctness of the error correction is not made after the fact, as with prior art, but is instead made before the error correction is carried out. In other words, once the input data component 20 has received the information string, parallel processing can be commenced with the error correction-use syndrome generating component 21 and the error detection-use syndrome generating component 22, so the processing time is shortened.

As discussed above, with the first embodiment, the decoding apparatus 2 is structured such that the dummy syndrome corresponding to the error detection-use syndrome S1 generated by the error detection-use syndrome generating component 22 is calculated backward from the error location detected by the error location detection component 25, this dummy syndrome is compared to the error detection-use syndrome S1, and a determination is made as to whether the correction is proper, so processing can be carried out in parallel with the error correction-use syndrome generating component 21 and the error detection-use syndrome generating component 22. Also, the determination as to whether the error correction is proper can be made on the syndrome level, which allows the detection of error locations to be simplified.

To facilitate the description of the above embodiment, the description was for a case in which the transmitting station side had only a transmitting component 1 and the receiving station side had only a receiving component 2, but it is also possible for the transmitting station and the receiving station each to have a transmitting component 1 and a receiving component 2.

Since the above embodiment is structured such that error correction encoding is performed after the communication contents have been subjected to error detection encoding, the information string contained in the communication data consists of information bits (I), an error detection-use check bit (EDCB1), and an error correction-use check bit. However, the present invention is not limited to the structure of the above first embodiment, and can also be applied to a case in which error detection encoding is performed after the communication contents have been subjected to error correction encoding.

Figure 4:
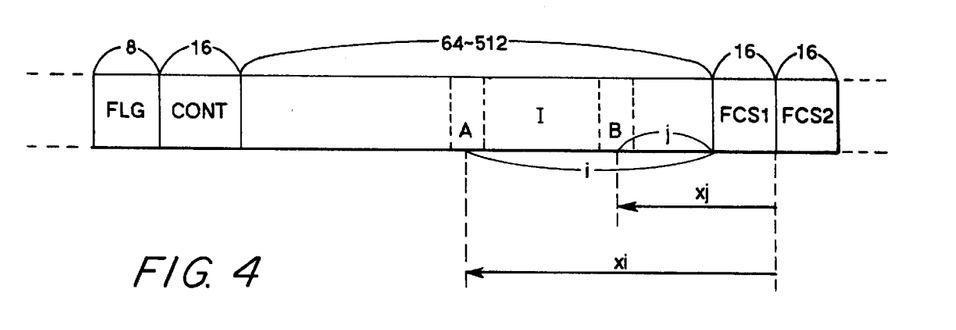
FIG. 4 is a diagram illustrating the data construction of the communication data when error detection encoding is performed after error correction encoding.

Specifically, as shown in FIG. 4, the data construction of the communication data in this case involves a reversal of the location of the error detection-use check bit FCS1 with the location of the error correction-use check bit FCS2 as compared to the communication data shown in FIG. 2.

As a result, with the error location detection component 25, the error location is determined with the last bit of the ECCB2 shown in FIG. 4 being used as the reference location.

Also, in this case 16 bits are added rather than 16 bits being subtracted from the coordinates of the error location I and j as shown in step 308 of FIG. 3 in the course of the dummy syndrome being computed by the dummy syndrome computation component 23b.

Furthermore, since errors produced in EDCB1 cannot be dealt with in error correction such as this, it is effective in cases when the information bit length is much longer than the bit length of EDCB1.

In the above description of the first embodiment, the last bit of EDCB1 or ECCB2 was used as the reference location because variable-length information bits were used. A second embodiment in which fixed-length information bits are used and in which the leading bit of the information bits is used as the reference location will now be described. Here again, the encoding apparatus 1 and the decoding apparatus 2 are structured in the same way as shown in FIG. 1.

Figure 5:
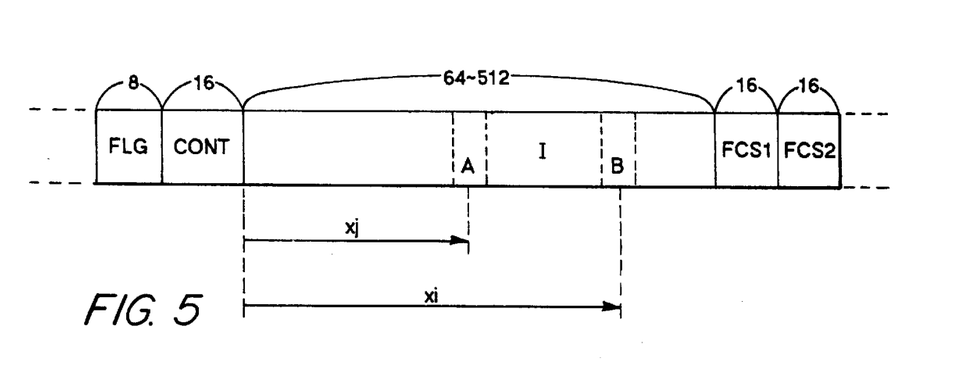
FIG. 5 is a diagram illustrating the data construction of the communication data when error detection encoding and error correction encoding are performed for fixed-length information bits.

FIG. 5 is a diagram illustrating the data construction of the communication data when error detection encoding and error correction encoding are performed for fixed-length information bits.

As shown in FIG. 5, the data construction in this case is the same as the data construction shown in FIG. 2, the only difference being that the information bits (I) are of a fixed length of 512 bits.

When the information bits (I) are thus of a fixed length, there is no need for the last bit of FCS1 or FCS2 to be used as the reference location for the error, so the first bit of the information bits (I) can serve as the reference location for the error.

A description will now be given of the difference between the first embodiment above and when the first bit of the information bits (I) is used as the reference location for the error.

In this embodiment, since information bits (I) of a fixed length are used, the error correction-use syndrome generating component 21 and error detection-use syndrome shown in FIG. 1 can both use the first bit of the information bits (I) as the error location reference point. As a result, the subtraction processing performed in step 308 in FIG. 3 of the first embodiment is unnecessary, and if the check matrix H1 used by the error detection-use syndrome generating component 22 is given the same code as the check matrix H2 used by the error correction-use syndrome generating component 21, or a punctured code thereof, the error correction-use syndrome S2 and the error detection-use syndrome S1 will match up even if a dummy syndrome is not used.

However, when, for example, the goal is dual error correction with the generator matrix G2 that performs error correction and the check matrix H2, it is enough for the generator matrix G1 and the check matrix H1 to allow single error correction and dual error detection, and it is impractical to go to all the trouble of increasing the code length using the same check matrix.

When a punctured code is used, the error detection capability of the resulting code will depend on which detection bit is eliminated, so careful study is required when such a code is used in an actual application.

Because of the above, even when the reference location is the leading bit of the information bits (I), it is still difficult to make a determination as to whether the error correction is proper on the syndrome level. Consequently, the present invention, which verifies that the correction is proper on the syndrome level by backward calculation of a dummy syndrome just as in the first embodiment, can be applied in this case as well.

Figure 6:
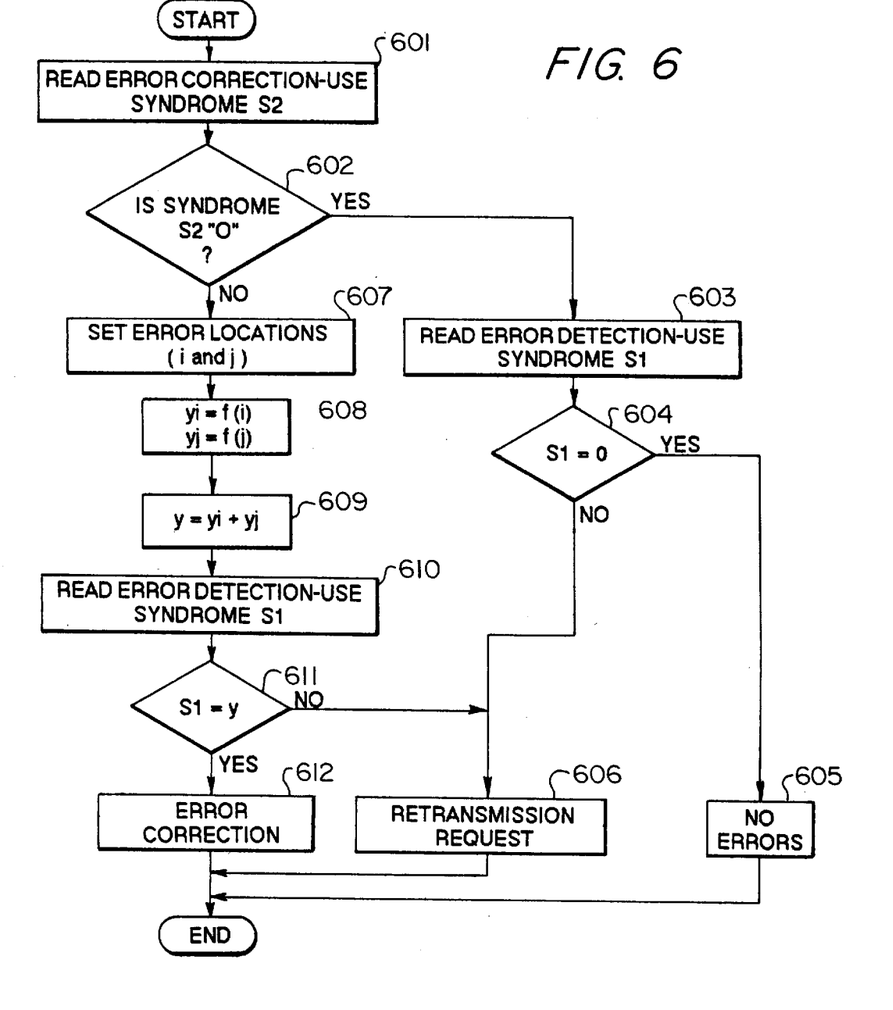
FIG. 6 is a flow chart illustrating the procedure of the error correction control component when the data construction shown in FIG. 5 is used.

FIG. 6 is a flow chart illustrating the procedure of the error correction control component 23 in this case.

Just as in the scenario shown in FIG. 3, the error correction control component 23 receives the error correction-use syndrome S2 from the bus control (step 601), determines whether or not this syndrome S2 is zero (step 602), and confirms whether there is an error.

When this syndrome S2 is zero, the error detection-use syndrome S1 is read (step 603), and a determination is made as to whether this error detection-use syndrome S1 is zero (step 604).

When this error detection-use syndrome S1 is zero, processing is completed and deemed to be error-free (step 605), but if this error detection-use syndrome S1 is not zero, a retransmission request is made to the transmission component 1 (step 606), after which processing is completed.

Meanwhile, when the error correction-use syndrome S2 is not zero in step 602, the error correction control component 23 specifies the locations I and j of the error bit to the error location detection component 25 (step 607). Here, the location of the error bit in this case is different from the case shown in FIG. 3, and is calculated using the first bit of the information bits (I) as the reference point.

Once the locations I and j of the error bit have been received from the error location detection component 25 by the error correction control component 23, the following calculation is performed (step 608), yi=f (I)
yj=f (i)

and yi and yj are added as below to determine y (step 609).
y=yi +yj

Next, the error detection-use syndrome S1 is read (step 610), and this error detection-use syndrome S1 is examined to see if it matches up with the dummy syndrome y (step 611). If the two do not match up, a retransmission request is made (step 606), and if the two do match up, the bit error at the detected location is corrected (step 612).

Thus, the present invention can be applied not only in cases in which the last bit of EDCB1 or ECCB2 is used as the error reference location, as in the first embodiment, but also in cases in which the first bit of the information bits (I) is used as the error reference location, as in this embodiment.

In the above description of the second embodiment, the first bit of the information bits (I) was used as the error reference location.

The description in the above first and second embodiments was for a case in which error detection encoding and error correction encoding were superimposed, but the present invention is not limited to this, and can also be applied to cases in which error detection encoding and error correction encoding are combined in three or more layers.

Figure 7:
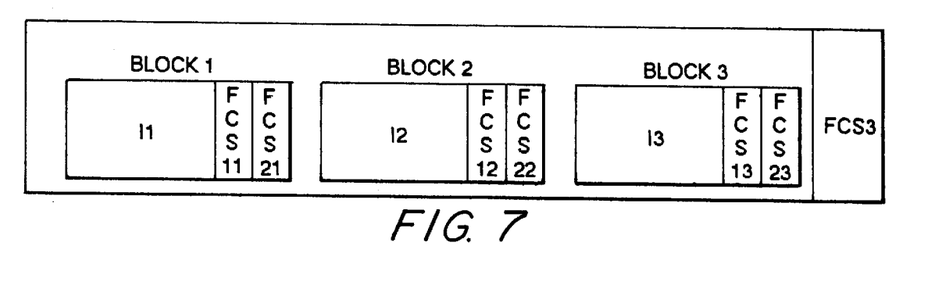
FIG. 7 is a diagram illustrating an example of the data construction when error detection encoding and error correction encoding are combined in three or more layers.

For example, as shown in FIG. 7, another possibility is a case in which the information bits (I) are divided into information bits I1 through I3, which are subjected to the error detection encoding and error correction encoding shown in the first or second embodiment, error detection-use check bits EDCB11 through EDCB13 and error correction-use check bits ECCB21 through EDCB23 are added, and the entire blocks 1 through 3 are subjected to error correction encoding to add an error correction-use check bit ECCB3.

In this case, the error location is detected for each block based on the error correction-use check bits ECCB21 through ECCB23, a dummy syndrome is calculated for each block from this error location, these calculated dummy syndromes are compared with the syndromes calculated based on the error detection-use check bits EDCB11 through EDCB13, and it is verified whether the error detection is proper on the syndrome level.

Also, the error locations for the entire communication data are determined based on the error correction-use check bit FCS that is added last, and dummy syndromes corresponding to each block are determined from these error locations, which verifies whether the error detection is proper on the syndrome level.

Thus, the present invention can also be applied to cases in which the error detection encoding and error correction encoding are combined in three or more layers. When error detection encoding and error correction encoding are multiplexed, the number of redundant bits to be added increases and there is a decrease in communication efficiency, so the error correction-use check bit FCS3 can be positioned as an important communication-use option.

A description will now be given for a case in which this error correction system is applied to a radio communication apparatus and a cable communication apparatus.

Figure 8A:
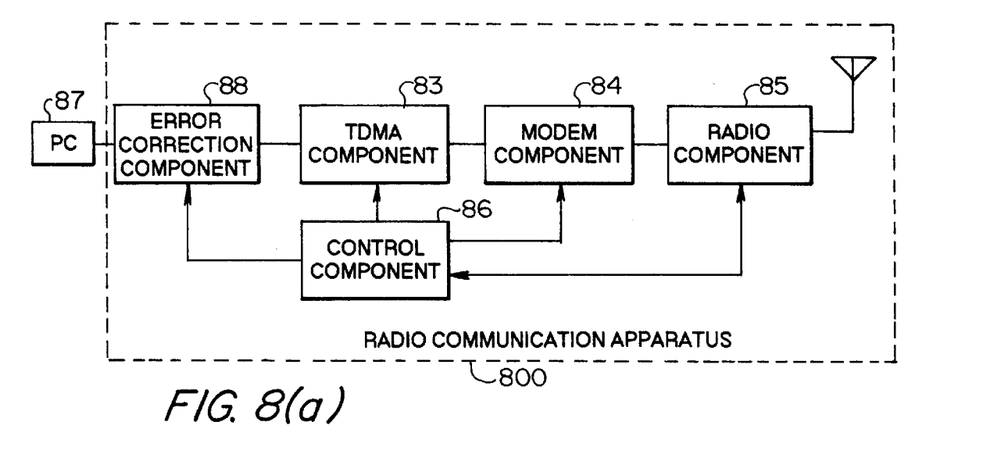
FIGS. 8(a) through 8(c) are block diagrams illustrating the structure of a radio communication apparatus and a cable communication apparatus to which the present invention is applied.

FIG. 8a is a block diagram illustrating the structure of a radio communication apparatus to which the present invention is applied.

As shown in FIG. 8a, this radio communication apparatus 800 performs data communication by a time division multiple access (TDMA) system, and is connected to a computer (PC) 87 that transmits and receives data.

This radio communication apparatus 800 comprises a TDMA component 83 composed of a TDMA decoder and a TDMA encoder, a modem component 84 composed of a demodulation component 401 and a modulation component 402, a radio component 85 equipped with a receiving component, a transmitting component, a synthesizer, and a transmitting/receiving wave-separating switch, a control component 86 that controls these components, and an error correction component 88 added to these.

This error correction component 88 is a processing component that performs the error correction pertaining to the present invention, and has a dual function as both the encoding apparatus 1 and the decoding apparatus 2 shown in FIG. 1. Specifically, this error correction component 88 performs error detection encoding and error correction encoding for the communication data received from the PC 87 and outputs this to the TDMA 83, and also receives communication data from the TDMA 83 and corrects errors produced in this received data while verifying the errors on the syndrome level.

This radio communication apparatus 800 here is connected to the PC 87 that performs data communication, but it is also possible to configure an independent radio data communication apparatus by providing a display component, input component, and the like to the inside of the radio communication apparatus 800.

Figure 8B:
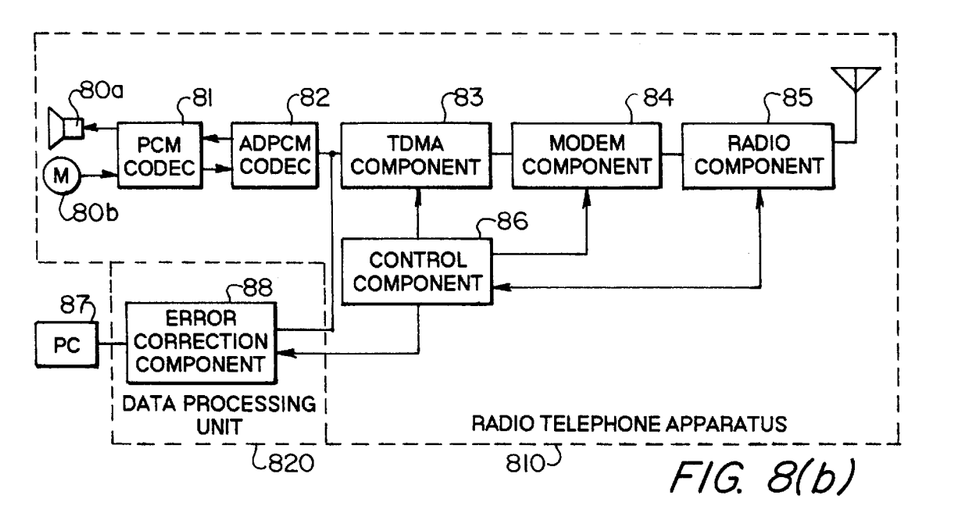

FIG. 8b is a block diagram illustrating the structure when the present invention is connected to a radio telephone apparatus.

As shown in FIG. 8b, this radio telephone apparatus 810 performs voice communication and data communication by a time division multiple access (TDMA) system, and is comprises a PCM codec 81 connected to a speaker 80a and a microphone 80b; an ADPCM codec 82; a TDMA unit 83 consisting of a TDMA decoder and a TDMA encoder; a modem unit 84 consisting of a demodulator 401 and a modulator 402; a radio unit 85 equipped with a reception component, a transmission component, a synthesizer, and a transmission/reception wave-separating switch; and a control unit 86 that controls these various components. This radio telephone apparatus 810 is connected to the PC 87 via a data processing unit 820 having an error correction component 88.

This error correction component 88, as discussed above, is a processing component that performs the error correction pertaining to the present invention, and has a dual function as both the encoding apparatus 1 and the decoding apparatus 2 shown in FIG. 1.

Thus, data communication in which error correction can be carried out efficiently is possible by connecting the radio telephone apparatus 810 to a data processing apparatus 820 that has the error correction component 88 with which proper error correction can be verified on the syndrome level.

Figure 8C:
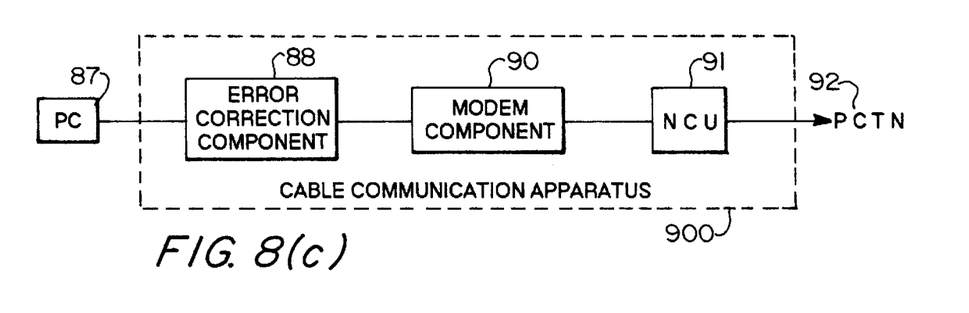

FIG. 8 is a block diagram illustrating the structure of a cable communication apparatus to which the present invention has been applied.

As shown in FIG. 8c, this cable communication apparatus has the error correction component 88 installed between a modem unit 90 and the PC 87. Specifically, the error correction component 88 performs error detection encoding and error correction encoding for the transmission data received from the PC 87, outputs this product to the modem unit 90, receives reception data from the modem unit 90, and verifies and corrects on the syndrome level any errors produced in the reception data.

As a result, redundantly encoded data can be output to a packet switching network (PCTN) 92 via an NCU (network control unit) and the modem unit 90, and error correction can be performed while errors for reception data received from the PCTN 92 are verified.

What is claimed is:

1. An error correction apparatus that receives a data train consisting of information bits indicating a communication content to which first check bits based on a first generator polynomial and second check bits based on a second generating polynomial are added, performs an error correction on the data train based on the second generating polynomial, and confirms whether the error correction is appropriate or not based on the first generator polynomial, wherein the error correction apparatus comprises:

first syndrome generation means for generating a first syndrome based on the first generator polynomial, the first syndrome being determined by an error produced in the information bits or in the first check bits;

second syndrome generation means for generating a second syndrome based on the second generator polynomial, the second syndrome being determined by an error produced in the data train;

error location detection means for detecting a location of an error produced in the data train based on the second syndrome generated by the second syndrome generation means; and error correction means for reverse-calculating a third syndrome based on the error location detected by the error location detection means and the first generator polynomial, and correcting the error produced in the information bits when the third syndrome is identical with the first syndrome generated by the first syndrome generation means.

2. An error correction apparatus as defined in claim 1, wherein the first syndrome generation means generates the first syndrome by taking an inner product of a check polynomial which is orthogonal to the first generator polynomial and has been prepared beforehand, and the information bits and the first check bits.

3. An error correction apparatus as defined in claim 1, wherein the second syndrome generation means generates the second syndrome by taking an inner product of a check polynomial which is orthogonal to the second generator polynomial and has been prepared beforehand, and the data train.

4. An error correction apparatus as defined in claim 1, wherein the error correction means corrects the error location detected by the error location detection means into a corrected error location in which a bit at right end of the information bits and the first check bits serves as a reference location, and reverse-calculates the third syndrome based on the corrected error location and the first generator polynomial.

5. An error correction apparatus as defined in claim 1, wherein the error correction means corrects the error location detected by the error location detection means into a corrected error location in which a bit at left end of the information bits serves as a reference location, and reverse-calculates the third syndrome based on the corrected error location and the first generator polynomial.

6. An error correction system comprises:

a transmission processing unit for transmitting a data train consisting of information bits indicating a communication content to which first check bits based on a first generator polynomial and second check bits based on a second generating polynomial are added; and a receipt processing unit for receiving the data train, performing an error correction on the data train based on the second generating polynomial, and confirming whether the error correction is appropriate or not based on the first generator polynomial, wherein the receipt processing unit comprises:

first syndrome generation means for generating a first syndrome based on the first generator polynomial, the first syndrome being determined by an error produced in the information bits or in the first check bits;

second syndrome generation means for generating a second syndrome based on the second generator polynomial, the second syndrome being determined by an error produced in the data train;

error location detection means for detecting a location of an error produced in the data train based on the second syndrome generated by the second syndrome generation means; and error correction means for reverse-calculating a third syndrome based on the error location detected by the error location detection means and the first generator polynomial, and correcting the error produced in the information bits when the third syndrome is identical with the first syndrome generated by the first syndrome generation means.

7. An error correction system as defined in claim 6, wherein the first syndrome generation means generates the first syndrome by taking an inner product of a check polynomial which is orthogonal to the first generator polynomial and has been prepared beforehand, and the information bits and the first check bits.

8. An error correction system as defined in claim 6, wherein the second syndrome generation means generates the second syndrome by taking an inner product of a check polynomial which is orthogonal to the second generator polynomial and has been prepared beforehand, and the data train.

9. An error correction system as defined in claim 6, wherein the error correction means corrects the error located detected by the error location detection means into a corrected error location in which a bit at right end of the information bits and the first check bits serves as a reference location, and reverse-calculates the third syndrome based on the corrected error location and the first generator polynomial.

10. An error correction system as defined in claim 6, wherein the error correction means corrects the error location detected by the error location detection means into a corrected error location in which a bit at left end of the information bits serves as a reference location, and reverse-calculates the third syndrome based on the corrected error location and the first generator polynomial.

11. An error correction method which includes the steps of receiving a data train consisting of information bits indicating a communication content to which first check bits based on a first generator polynomial and second check bits based on a second generator polynomial are added, performing an error correction on the data train based on the second generating polynomial, and confirming whether the error correction is appropriate or not based on the first generator polynomial, characterized in that the error correction method comprises:

a first step of generating a first syndrome based on the first generator polynomial, the first syndrome being determined by an error produced in the information bits or in the first check bits, and a second syndrome based on the second generator polynomial, the second syndrome being determined by an error produced in the data train;

a second step of detecting a location of an error produced in the data train based on the second syndrome; and a third step of reverse-calculating a third syndrome based on the error location detected in the second step and the first generator polynomial, and correcting the error produced in the information bits when the third syndrome is identical with the first syndrome.

12. An error correction method as defined in claim 11, wherein the first step generates the first syndrome by taking an inner product of a check polynomial which is orthogonal to the first generator polynomial and has been prepared beforehand, and the information bits and the first check bits, and generates the second syndrome by taking an inner product of a check polynomial which is orthogonal to the second generator polynomial and has been prepared beforehand, and the data train.

13. An error correction method as defined in claim 11, wherein the third step corrects the error location detected in the second step into a corrected error location in which a bit at right end of the information bits and the first check bits serves as a reference location, and reverse-calculates the third syndrome based on the corrected error location and the first generator polynomial.

14. An error correction method as defined in claim 11, wherein the third step corrects the error location detected in the second step into a corrected error location in which a bit at left end of the information bits serves as a reference location, and reverse-calculates the third syndrome based on the corrected error location and the first generator polynomial.

* * * * *